April 25, 1967 E. C. WISMAN 3,316,131

METHOD OF PRODUCING A FIELD-EFFECT TRANSISTOR

Filed Aug. 15, 1963

Emery C. Wisman
INVENTOR

BY John G. Graham

ATTORNEY

United States Patent Office 3,316,131
Patented Apr. 25, 1967

3,316,131

METHOD OF PRODUCING A FIELD-EFFECT TRANSISTOR

Emery Clarance Wisman, Richardson, Tex., assignor to Texas Instruments Incorporated, Dallas, Tex., a corporation of Delaware Filed Aug. 15, 1963, Ser. No. 302,427
4 Claims. (Cl. 148—175)

This invention relates to transistors and more particularly to field-effect transistors.

A field-effect transistor is a device which has a semiconductor current path whose resistance is modulated by the application of a transverse electric field. The field is created by reverse biasing a P-N junction, which causes depletion (removing of current carriers) and thereby controls the conduction thickness of the current path. A portion of the current path is often referred to as the "channel," and it is the channel region, more specifically, which is modulated. The current path begins at an electrode called the source and terminates at an electrode called the drain. On either side of the channel is a gate region having an impurity concentration opposite from that of the channel region.

For a field-effect transistor in which the P-N junctions are abrupt and the channel has uniform resistivity, the major effects of neutron irradiation on such transistor characteristics may be predicted by considering carrier removal and mobility change of the channel. With neutron induced carrier removal from the channel, there will be an increase in the channel depletion region for a given gate-to-channel voltage. Thus one result of carrier removal will be a decrease in the pinch-off voltage, the effect of carrier removal on such voltages being given by the equation:

$$W_0 = q\frac{Na^2}{2K}$$

where $W_0$ is the pinch-off voltage, N is the carrier density, K is the dielectric constant, $q$ the carrier charge and $a$ is half the channel thickness.

Another result of carrier removal is a decrease in the maximum current capability of the transistor as there are fewer carriers to contribute to the current. The effect of carrier removal on the current capability is shown in the equation for $I_{D0}$, the saturation drain current per centimeter $I_{D0}=g_{m0}W_0/3$ where $g_{m0}=2aNq\mu/L$ and the latter is the maximum transconductance of the transistor, L is the channel width and $\mu$ it the mobility of the carriers. Any decrease in mobility resulting from neutron irradiation causes an added decrease in the maximum current capability of the transistor over the decrease resulting from carrier removal.

The magnitude of the changes in the field-effect transistor characteristics as a result of neutron irradiation described above is determined by the incident integrated neutron flux and its spectrum as well as the initial channel doping and mobility. As the carrier removal rate may be in the order of 5 cm.$^{-1}$ neutron $^{-1}$, initial channel doping levels in the order of $10^{16}$ cm.$^{-3}$ or greater are necessary to produce field-effect transistors having a higher radiation resistance than present devices.

The high doping required for high radiation tolerant devices along with low pinch-off voltage, necessitates narrower channels than formed in prior art devices. In combination with the low pinch-off voltage, a higher breakdown voltage is needed to give a desirable operating range.

It is, then, an object of this invention to provide an improved field-effect transistor.

Another object is to provide a radiation tolerant field-effect transistor.

Still another object is a novel method by means of which a narrow channel width is effectively obtained with respect to the length of a field-effect transistor.

Yet another object is to provide a field-effect transistor in which the breakdown voltage, the drain and the gate are increased over that of conventional structures.

Other objects and features of the invention will be apparent from the following detailed description, taken in conjunction with the appended claims and the attached drawing in which:

Figure 1:
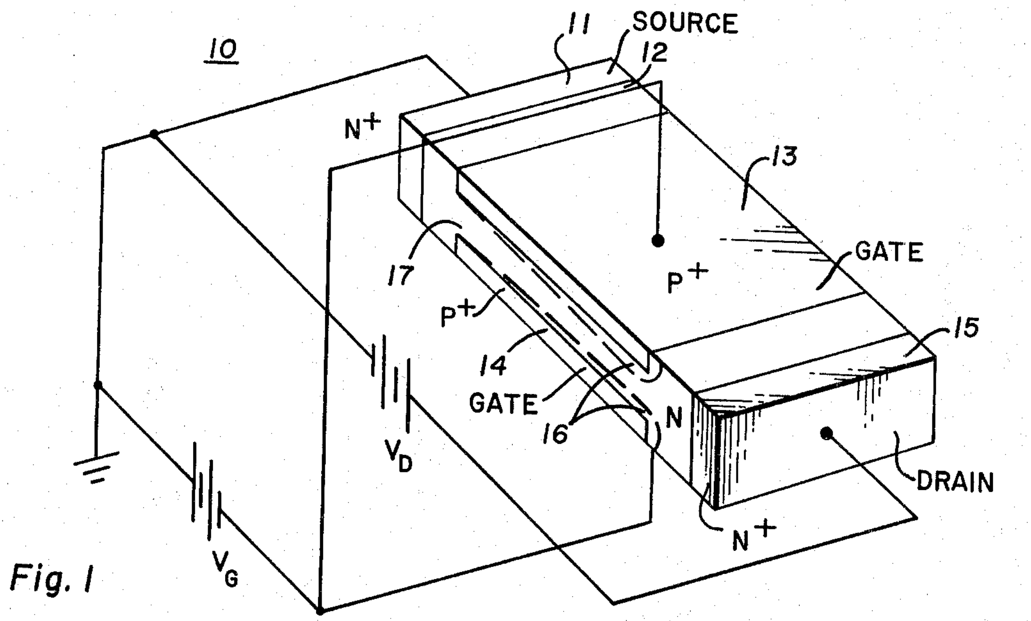
FIGURE 1 depicts a field-effect transistor of conventional design showing the space charge around the junction and extending through the channel region.

A field-effect transistor is essentially a device consisting of a channel layer interposed between two electrically connected layers called a gate. The impurity doping of the gate is opposite to that of the channel. FIGURE 1 illustrates a simple device in which the gates 13 and 14 lie on either side of the channel 17. The N+ region 11 on one end of the channel 17 constitutes the source and the N+ contact 15 on the other end is the drain.

Figure 2:
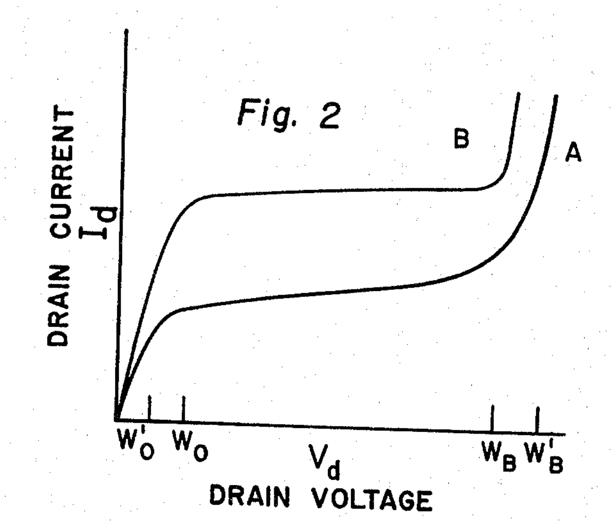
FIGURE 2 is a graph illustrating irradiation effects on field-effect transistor characteristics.

Under operating conditions, majority carrier (electron) conduction is induced in the channel between source 11 and drain 15 by battery $V_D$. When reverse bias is applied to the channel-gate junctions by battery $V_G$, a space charge 16 is formed in the N-type channel 17. Carriers are depleted in the space charge region and thus the current carrying channel path is reduced in size. The shape of the depletion layer 16 is determined by voltages $V_D$ and $V_G$. A theoretical description of the resulting channel path is obtained by a solution of a two-dimensional potential problem. With $V_D=O$, there exists a potential $V_G=W_0$ which completely depletes the N-channel 17 in the region of the gates 13 and 14. $W_0$ is called the "pinch-off" voltage. This pinch-off voltage is reduced by the application of the potential $V_D$. In the pinch-off condition, any further increase in $V_D$ will not appreciably increase the drain current, $I_D$; and the resulting current-voltage characteristics resemble those of a pentode vacuum tube. Prior to pinch-off, the device operates in an ohmic region and the characteristics resemble those of a vacuum tube triode. FIGURE 2 shows a characteristic curve of a field-effect transistor; B is the normal curve, A is the curve after irradiation of the device. $W_B$ is the breakdown voltage of the device.

Figure 3:
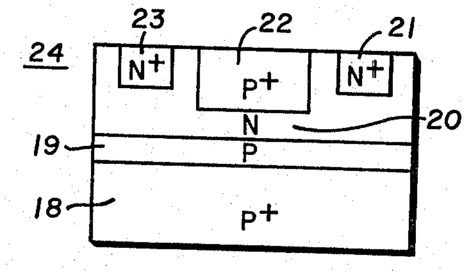
FIGURE 3 is an end sectional view of one embodiment of the invention.

One embodiment of the present invention is shown in FIGURE 3. Shown is a semiconductor device 24 comprising a channel region 20, for example 5 ohms-centimeter, between a low resistivity gate 22, for example 0.01 ohm-centimeter, on one side and two regions 18 and 19 on the other. The gate region 18 is a low resistivity P region which is isolated from the N channel 20 by a high resistivity P region 19. The region 19 reduces the non-uniform effects in the channel by reducing the effect of diffusion from the region 18 into the channel region 20, a diffusion which would occur were the P+ region 18 in intimate contact with the N channel region 20 when the diffused region 22 is subsequently formed. The method of making the device may be described as a double-epitaxial, double diffusion method, and is as follows:

A very low resistive P-type layer 18, for example 0.01 ohm-centimeter, is epitaxially deposited on a very high resistive N or P-type base 19, for example 2000 ohms-centimeter. For purposes of illustration, it is assumed that the base 19 material is P-type. The base 19 may be on the order of six mils and the epitaxial layer six mils. Next, the base layer 19 is lapped or polished to a thickness 0.2–0.6 mil or about 0.3 mil. A second epitaxial layer 20 of N-type material on the order of 5-ohms-centimeter is deposited upon the lapped surface of base 19. Gate 22 is diffused into layer 20 as a very low resistive P region, for example 0.01 ohm-centimeter. Into the layer 20 is diffused low resistive $N^+$ contacts 21 and 23. Contact 23 acts as the source contact and contact 21 is used for the drain contact.

Distinctive features of the device made by the above method and shown in FIGURE 3 are that an N epitaxial region is not grown directly on a low resistivity P base, that the nonuniformities associated with the bottom gate are reduced as the channel is mainly defined by the low resistive N-layer, and that the depletion region moves much faster through the high resistive region than in the low resistive region, so that the characteristics of the device are governed by the properties of the low resistive layer.

Figure 4:
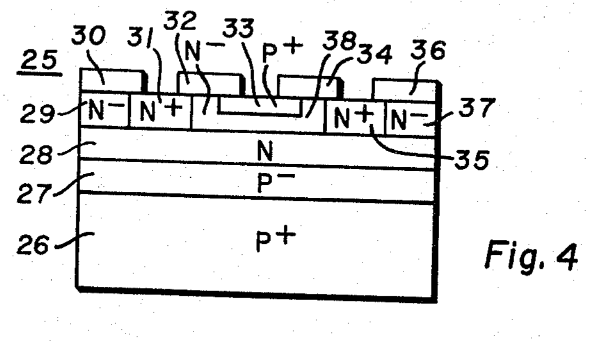
FIGURE 4 is an end sectional view of another embodiment of the invention.

A second embodiment of the invention is shown in FIGURE 4. This device differs from a conventional structure in that very low conductive $P^-$ and $N^-$ regions form an isolation between the gate and channel, and these regions may be made to have a negligible effect on the characteristics of the field-effect transistor. The inclusion of the $P^-$ and $N^-$ layers provides several advantages, in that: (1) a greater separation between the two $P^+$ gates is allowed, permitting easier fabrication, better control and thinner channels; (2) the breakdown voltage between the drain and gate is increased over that obtainable in a conventional planar structure; (3) variations in the thickness of the $P^-$ and $N^-$ regions, whatever the cause, will appear in the leading edge of the channel depletion region, reduced by approximately $\frac{1}{30}$ the variation in the high resistivity regions so that irregularities in the $P^+$ gate fronts are canceled, the fractional value being influenced by the relative resistivities of the adjacent regions; and (5) the isolation between the gate and channel will produce low capacitances.

FIGURE 4 pictures a device having a $P^+$ gate 26 and an N-channel 28 with an $N^-$ layer 38 on one side and a $P^-$ layer 27 on the other. A second $P^+$ gate area 33 has been diffused into the $N^-$ layer 38. The source contact 31 and drain contact 35 are $N^+$ regions and have also been diffused into the $N^-$ layer 38. Also shown, are oxide regions 30, 32, 34 and 36 used to protect the surface of the device. The fabrication of the device is as follows:

An epitaxial deposition (layer 26) of boron doped semiconductor material about six mils thick and having a resistivity less than 0.01 ohm-centimeter is made onto a float zone substrate of about 2000 ohm-centimeter, P-type material 27, also about 6 mils thick. The $P^-$ layer 27 is then mechanically polished to a thickness on the order of 10 to 30 times the half channel thickness, the thickness of layer 27 being about 0.3 mil or within the range of 0.2 to 0.6 mil. An oxide layer is then deposited over the $P^+$ material so that only the $P^-$ surface is exposed. A thin N-type, antimony doped epitaxial layer 28 is deposited on the $P^-$ surface to form the channel layer, the thickness of this channel layer being less than 0.06 mil, the resistivity thereof varying between 0.6 ohm-centimeter to 0.09 ohm-centimeter. As the thickness uniformity of the channel deposition is important to obtain maximum current capabilities, it is desirable to limit the thickness variation of the channel layer within about 10%.

The channel deposition is followed by another N-type, antimony doped epitaxial layer 38 of higher resistivity on the order of 40 ohms-centimeter. The thickness of this deposition should be such that the channel operation is independent of surface conditions, but thin enough so that deep diffusions are not required to provide contact of the drain and source to the channel and to produce an effective top gate. A thickness on the order of 0.1 mil is adequate.

One deposition-diffusion is made to produce the source-drain contacts 31 and 35 and a second deposition-diffusion is made to produce the top gate 33 whereas the channel is doped with antimony, the gate will be doped with boron, and the source-drain contacts will be doped with phosphorus to utilize the difference in diffusion coefficients thereby reducing epitaxial channel junction movement while the deposition-diffusions are being made. An etch of the source and drain contact areas may be necessary to provide shallower diffusions for the source and drain.

The above methods, including specific impurity concentrations and layer thickness, are given by way of example only, and should not be construed as limitations on the invention. Although a particular structure is shown for simplicity, it should be understood that other structures, for example planar, may be desirable to provide for ease in fabrication and stabilization of junctions.

It is apparent then that although the invention has been described with reference to specific embodiments, modifications and substitutions may be made that will fall within the scope of the invention as defined by the appended claims.

What is claimed is:

1. The method of making a semiconductor device of the field-effect type comprising the steps of: epitaxially growing a layer of P-type semiconductor material on a major face of a high resistivity semiconductor substrate, lapping the other major face of said substrate to reduce the substrate thickness to between 0.2 to 0.6 mil, epitaxially growing a second layer of N-doped semiconductor material on said lapped major face of said substrate, diffusing two $N^+$ regions into said N-doped layer, and diffusing a $P^+$ region into said N-doped layer intermediate said two $N^+$ regions.

2. The method making a field-effect transistor comprising the steps of: depositing a first epitaxial layer of about 0.01 ohm-centimeter P-type semiconductor material on a major face of a P-type semiconductor substrate of about 2000 ohm-centimeter, lapping the other major face of said substrate to reduce the thickness of said substrate to between 0.2 to 0.6 mil, depositing a second epitaxial layer of N-type 5 ohm-centimeter semiconductor material on said lapped major face of said substrate, and diffusing into said second epitaxial layer two N-type impurity contact regions and one P-type impurity contact region.

3. The method of making a semiconductor device of the field-effect type comprising the steps of: depositing a first epitaxial layer of P-type semiconductor material on a major face of a high resistivity P-type semiconductor substrate, lapping the other major face of said P-type substrate to reduce the substrate thickness to about 0.3 mil, depositing a second epitaxial layer of N-type semiconductor material on said lapped major face of said substrate, depositing a third epitaxial layer of semiconductor material on said second epitaxial layer, diffusing two N-type contact regions into and through said third epitaxial layer for making contact with said second layer, and diffusing a P-type region into said N-type third layer intermediate said two N-type contact regions.

4. The method of making a semiconductor device of the field-effect type comprising the steps of: depositing a first epitaxial layer of P-type semiconductor material of about 0.01 ohm-centimeter on a major face of a 2000 ohm-centimeter P-type semiconductor substrate, lapping the other major face of said substrate to reduce the thickness of said substrate to about 0.3 mil, depositing a second epitaxial layer of about 0.09–0.6 ohm-centimeter N-type semiconductor material on said lapped major face of said substrate, depositing a third epitaxial layer of about 40 ohms-centimeter N-type semiconductor material on said second epitaxial layer, diffusing two N-type contacts into said third epitaxial layer, said contact extending therethrough to contact said second epitaxial layer, and diffusing a P-type contact into said third epitaxial layer intermediate said two N-type contacts.

References Cited by the Examiner

UNITED STATES PATENTS

| | | | |
|---|---|---|---|
| 2,952,804 | 9/1960 | Franke | 317—235 |
| 3,000,768 | 9/1961 | Marinace | 148–175 |
| 3,007,119 | 10/1961 | Barditch | 317—235 |
| 3,044,147 | 7/1962 | Armstrong | 148—186 |
| 3,152,928 | 10/1964 | Hubner | 148—175 |
| 3,165,811 | 1/1965 | Kleimack et al. | 148—175 |
| 3,171,762 | 3/1965 | Rutz | 148—175 |
| 3,223,904 | 12/1965 | Warner et al. | 317—235 |
| 3,236,701 | 2/1966 | Lin | 148—175 |

OTHER REFERENCES

Van Ligten, "Epitaxially Diffused Transistor Fabrication," IBM Bulletin, Vol. 4, No. 10, March 1962, pages 58–59.

DAVID L. RECK, *Primary Examiner.*

JAMES D. KALLAM, *Examiner.*

A. M. LESNIAK, N. F. MARKVA, *Assistant Examiners.*